United States Patent [19]

Suzuki et al.

[11] Patent Number: 4,578,775
[45] Date of Patent: Mar. 25, 1986

[54] MAGNETIC BUBBLE MEMORY DEVICE

[75] Inventors: Ryo Suzuki, Kodaira; Yutaka Sugita, Tokorozawa; Teruaki Takeuchi, Kokubunji; Naoki Kodama; Masatoshi Takeshita, both of Hachioji; Hiroshi Umezaki, Koganei, all of Japan

[73] Assignee: Hitachi, Ltd., Tokyo, Japan

[21] Appl. No.: 505,379

[22] Filed: Jun. 16, 1983

[30] Foreign Application Priority Data

Jun. 16, 1982 [JP] Japan ................................ 57-102060

[51] Int. Cl.4 .............................................. G11C 19/08
[52] U.S. Cl. .......................................... 365/36; 365/39
[58] Field of Search ...................... 365/15, 16, 36, 43, 365/39

[56] References Cited

U.S. PATENT DOCUMENTS 3,921,157 11/1975 Sandfort ................................ 365/43
4,086,572 4/1978 Bullock ................................. 365/36
4,358,830 11/1982 George ................................. 365/39
4,360,904 11/1982 Gergis .................................. 365/36
4,503,517 3/1985 Umezaki et al. ...................... 365/36

FOREIGN PATENT DOCUMENTS 0025831 2/1980 Japan .................................... 365/16
0186287 11/1982 Japan .................................... 365/36
0125289 7/1983 Japan .................................... 365/36

Primary Examiner—James W. Moffitt
Attorney, Agent, or Firm—Antonelli, Terry & Wands

[57] ABSTRACT

A magnetic bubble memory device is disclosed which is equipped with a minor loop of a magnetic bubble propagation track formed by ion implantation and a major loop or major line of a magnetic bubble propagation track consisting of a soft magnetic film and in which the thickness of an insulating film at at least the junction between the minor loop and the major loop or major line is less than the thickness of insulating film at the major line or major loop.

16 Claims, 8 Drawing Figures

MAGNETIC BUBBLE MEMORY DEVICE

BACKGROUND OF THE INVENTION

1. Field of the Invention

This invention relates to a magnetic bubble device. More particularly, the present invention relates to a magnetic bubble device which can propagate small magnetic bubbles of an extremely small diameter and is suitable for use in electronic computers, electronic switchboards, and so forth.

2. Description of the Prior Art

As is well known in the art, devices which are referred to as "permalloy devices" have been used as magnetic bubble devices in the past.

The devices of this kind are characterized in that a film of a soft magnetic material (permalloy) 1 having a plan such as that shown in FIG. 1, for example, is formed over a film of a magnetic garnet (not shown) capable of retaining magnetic bubbles, such as $(YSm-LuCa)_3(FeGe)_5O_{12}$ for example, thereby defining a magnetic bubble propagation track, and a rotating field is applied parallel to the garnet film so as to propagate the magnetic bubbles 2.

A generator, a transfer gate, a swap gate and a replicator for generating, transferring, swapping and replicating the magnetic bubbles, respectively, are formed by a conductor pattern 5 consisting of an Al-Cu or Au film, for example, as shown in FIG. 2 showing a section thereof. The conductor pattern 5 is sandwiched between the permalloy pattern (film) 1 and the magnetic garnet film 3 via insulating films 6 and 4, respectively. When a controlling pulse current is made to flow through the conductor pattern 5, various functions of the magnetic bubbles such as their generation or transfer can be executed.

Generally, a magnetic garnet film 3 which is capable of retaining magnetic bubbles is formed by epitaxial growth on the (111) plane of a substrate of a single non-magnetic crystal such as $Gd_3Ga_5O_{12}$, but this substrate of a single non-magnetic crystal is omitted from the drawing for ease of comprehension because it does not pertain directly to the gist of the present invention.

The pattern width and gap dimensions of the permalloy propagation track 1 have been reduced markedly as the density as well as the degree of integration of the bubble device has increased. When fabricating a device having a bit period of 8 $\mu$m using bubbles having a diameter of approximately 2 $\mu$m, for example, the pattern and gap dimensions must be accurate to approximately 1 $\mu$m. In order to further increase the density of devices in future by the use of permalloy devices, delicate permalloy patterns of less than 1 $\mu$m must be formed accurately over the entire surface of the chip, this is extremely difficult technically.

A bubble device of a novel type has been drawing increasing attention in recent years (U.S. Pat. No. 3,828,329). In place of the propagation track consisting of a conventional soft magnetic material such as a permalloy, this prior art is characterized by including a propagation track which is formed by ion implantation and the device is referred to as an "ion-implanted device". In accordance with this prior art, the desired portion of the magnetic garnet film 3 is covered with a mask (not shown) having the shape of contiguous discs, as shown in FIG. 3, ions such as those of Ne, $H_2$, etc., are implanted into the surface of the magnetic garnet film so that an ion-implanted region 7 is defined in the exposed portion outside the mask with the contiguous disc shape, and the magnetization of the region 7 is directed parallel to the film plane. When a rotating field is applied parallel to the garnet film, bubbles can be transferred along the edges of the contiguous discs (propagation track) 8 in the same way as in a conventional permalloy device. This ion-implanted device has an essential feature in that the pattern dimensions of the propagation track 8 can be about twice that of the propagation track of a permalloy device, so that the device can be fabricated easily and is suitable for a high density device.

The critical problems for the practical application of this ion-implanted device are that the functions of the replicator, transfer gate, swap gate, etc., are not sufficiently stable, a block replicator can not be formed easily and the device can not operate at high speed.

To eliminate these problems, a magnetic bubble memory device has been proposed (U.S. Patent Application Ser. No. 375,344, filed May 5, 1982 and now U.S. Pat. No. 4,528,645) in which a minor loop consists of a propagation track formed by ion implantation, and at least part of a major loop (or major line) as described above, as well as at least part of the junction between the minor loop and the major loop are formed by the use of a permalloy film.

For convenience, the device having such a structure will be hereinafter referred to as a "hybrid bubble memory device": In this device, the minor loop that accounts for the larger part of the area of the device is formed by ion implantation suitable for a high density memory, while part of each of the major loop (or major line), replicator, transfer gate, detector and generator is formed of a film of a soft magnetic material such as a permalloy. This arrangement makes it extremely easy to fabricate a minor loop for transferring small magnetic bubbles, to ensure the stable operations of the replicator, transfer gate, swap gate, etc., that have not been accomplished by conventional ion-implanted devices, and also to fabricate the block replicator easily.

Since this hybrid bubble memory device includes a propagation track formed by ion implantation and a propagation track consisting of a soft magnetic film, however, it is not free from the problem that when magnetic bubbles pass through the junction between the tracks, the propagation margin of the magnetic bubbles drops markedly. This problem has to be solved before the hybrid bubble memory device can be put to practical use.

DESCRIPTION OF THE PREFERRED EMBODIMENTS

Figure 4A:
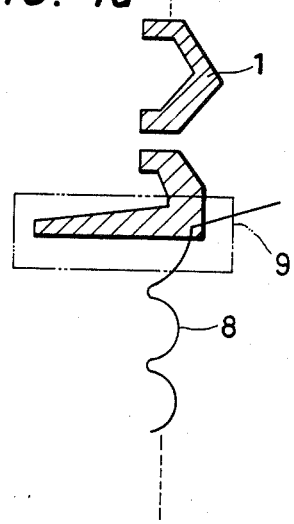
FIGS. 4a and 4b are plan and sectional views, respectively, of the junction between a propagation track of a soft magnetic film and a propagation track formed by ion implantation.
Figure 4B:
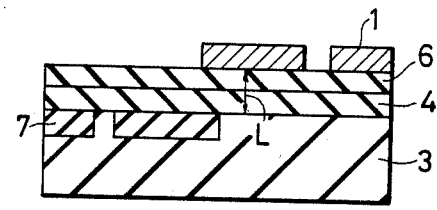

FIG. 4a is a plan view of the junction between an ion-implanted propagation track 8 and a permalloy propagation track 1 and FIG. 4b is a section of the region of FIG. 4a enclosed by a dashed line. In order to transfer magnetic bubbles smoothly from the ion-implanted magnetic track 8 to the permalloy propagation track 1, it is necessary that the driving force acting upon the magnetic bubbles from the permalloy propagation track 1 is sufficiently large.

To increase the driving force, it is effective either to increase the size of the propagation track 1 or to reduce the gap L (sum of the thicknesses of the two insulators 4, 6) between the permalloy propagation track 1 and the magnetic film 3 in which the magnetic bubbles are, as depicted in FIG. 4b.

Figure 1:
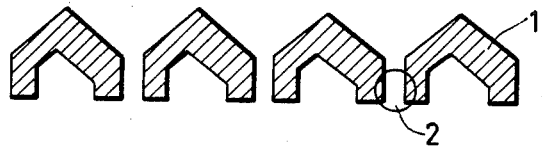
FIG. 1 is a plan view of a propagation track consisting of a soft magnetic film.
Figure 2:
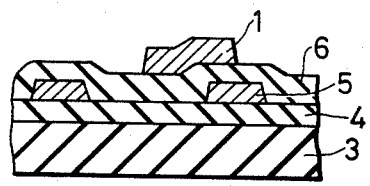
FIG. 2 is a section of the structure of the principal parts of a magnetic bubble memory device having the propagation track consisting of a soft magnetic film.
Figure 3:
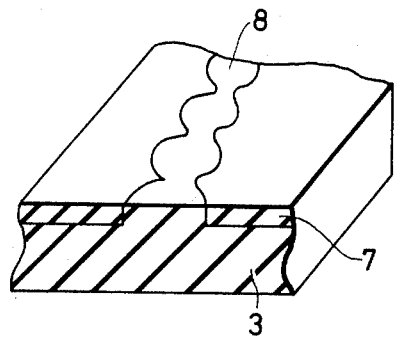
FIG. 3 shows schematically a propagation track formed by ion implantation.

However, an increase in the driving force by increasing the site of the propagation track 1 results in an increase in the area needed, this is of course extremely undesirable. If the film thickness of the insulator 6 is reduced so as to reduce the gap L, steps are generated in the permalloy pattern 1 where the permalloy pattern 1 overlaps the conductor pattern 5 as shown in FIG. 2, thereby generating undesirable magnetic poles. As a result, the transfer characteristics of the magnetic bubble drop markedly. For this reason, it is not desirable to reduce the film thickness of the insulator 6 by much so as to reduce the gap L.

Figure 5:
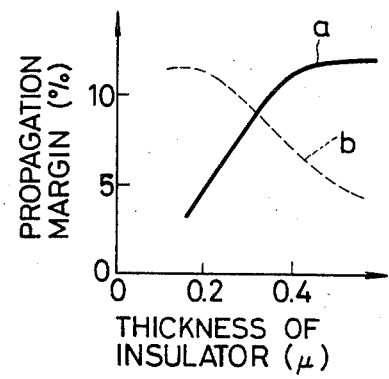
FIG. 5 is a diagram of the relationship between the thickness of the insulator (insulating film) and the propagation margin.

According to studies made by the inventor of the present invention, the propagation margin of magnetic bubbles (the range of the biasing magnetic field where the magnetic bubble can propagate normally increases with increasing thickness of the insulator 6 as represented by the curve a in FIG. 5, and the thickness is preferably a minimum of approximately 0.3 μm.

On the other hand, the propagation margin of a magnetic bubble at the junction 9 between the propagation track 8 formed by ion implantation and the propagation track 1 of soft magnetic film of FIGS. 4a and 4b drops markedly if the sum of the thicknesses of the insulators 4 and 6 becomes greater than about 0.2 μm, as represented by the dashed line b in FIG. 5. It has thus been found that an increase in the thickness of the insulators 4, 6 is not desirable from this point of view.

In other words, a magnetic bubble memory device having satisfactory characteristics can not be obtained by merely connecting a minor loop consisting of a propagation track formed by ion implantation to another part of soft magnetic film, and some definite measures must be taken in order to prevent a drop of the propagation margin at the junction between them.

Figure 6:
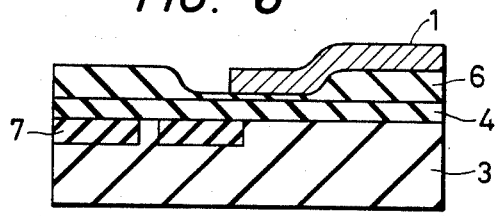
FIGS. 6 and 7 are each sections of the structures of the principal parts of different embodiments of the present invention.

As shown in FIG. 6 which is a section of the principal parts of a device in accordance with one embodiment of the present invention, the present invention reduces the thickness of the insulator in the proximity of the junction between the propagation track 1 of soft magnetic film and the propagation track 7 formed by ion implantation, and thus reduces the gap L between the permalloy propagation track 1 and the magnetic film 3 in this region.

Since the gap L at the junction between the two propagation tracks is thus reduced, a drop in the propagation margin at this junction can be prevented. In the regions other than in the proximity of the junction, on the other hand, the occurrence of steps in the permalloy propagation track 1 over the conductor pattern 5 is prevented because the insulator is thick in these regions. Hence a drop in the propagation margin due to steps can also be prevented.

In FIG. 6, one (6) of the insulator is selectively etched from above in the desired regions so as to reduce the thickness thereof, but etching can of course be continued further to reduce the thickness of the lower insulator 4 as well.

Figure 7:
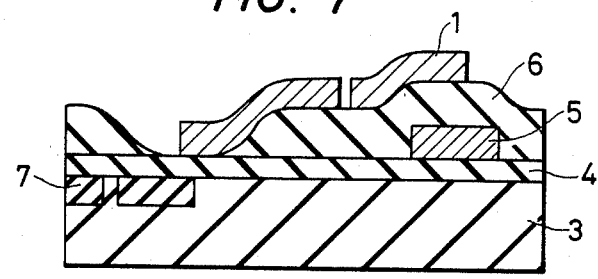

FIG. 7 shows another embodiment of the present invention. In this embodiment, the present invention is applied to the junction having the structure shown in section in FIG. 4b.

First the ion-implanted propagation track 7 is formed by ion implantation in the customary manner onto the magnetic garnet film 3 capable of retaining magnetic bubbles. The insulator 4 is then formed by depositing $SiO_2$ to a thickness of 0.1 μm. Gold is vacuum-deposited thereon to a thickness of 0.35 μm to form the conductor pattern 5. A polymer resin is then coated thereon to a thickness of 0.4 μm to form the insulator 6. The polymer resin film in the region 9 indicated by a dashed line in FIG. 4a is selectively removed. This removal step could, of course, be carried out by conventional photo etching, but the present invention employs a specific method. Namely, when exposing the photoresist, a gap is left intentionally between the photoresist and the photomask so as to blur the outline of the transfer pattern formed on the photoresist film. In this manner, the steep slopes in section of the edges of the photoresist pattern can be made smooth and gentle. In this way, the exposed regions of the polymer resin film 6 are etched to the desired thickness by ion milling, and the thickness of the polymer resin layer 3 at the junction can be made to change smoothly and gently. According to this arrangement, large steps are not generated even when the soft magnetic film 1 overlaps, and extremely good results can be obtained without generating magnetic poles due to steps.

In this embodiment, since the insulator 6 of the polymer resin is between the conductor pattern 5 and the soft magnetic pattern 1, steps generated in the soft magnetic pattern 1 over the conductor pattern can be reduced. Since the thickness of the insulator at the junction between the propagation track 7 formed by ion implantation and the soft magnetic pattern is small, and since the gap between the soft magnetic pattern 1 and the magnetic garnet film 3 is also small, a hybrid magnetic bubble memory device can be obtained which has excellent characteristics.

In this embodiment, the insulator 6 of polymer resin can also be etched selectively by ordinary photo etching. After the insulator of polymer resin (preferably, a heat-resistant polymer resin such as polyimide isoindroquinozolinedione) at the junction is selectively etched and removed, the exposed region of the lower insulator 4 may also be etched to reduce its thickness, or it may be removed.

The embodiment described above uses a heatresistant polymer resin film and $SiO_2$ as the upper and lower insulators 6 and 4, respectively, but other known insulating materials may also be used as the insulators, and the same material may be used for both insulators.

It is, however, preferable to use a polymer resin film for at least the upper insulator 6 in order to reduce the steps in the soft magnetic pattern 1 produced by the conductor pattern 5. Temperatures of 300° to 350° C. are used in the formation of the soft magnetic pattern, hence the polymer resin film must be resistant to heat treatments within this temperature range.

Various heretofore known heat-resistant polymer resins can be used for this purpose, as typically exemplified by polyimide isoindro-quinozolinedione.

As shown by the curve a in FIG. 5, the film thickness of the heat-resistant polymer resin is at least approximately 0.3 μm in the regions other than at the junction and the minor loop. If the film thickness is too great, however, the gap between the magnetic film 3 and the soft magnetic pattern 1 is increased so that the detection of the magnetic bubbles becomes difficult. For this reason, the sum of the film thicknesses of the upper and lower insulators 6 and 4 is preferably at most about 0.8 μm.

The upper and lower insulators 6 and 4 at the junction and at the region of the minor loop with the propagation track formed by ion implantation may be removed so as to expose the surface of the magnetic film 3. If the lower insulator 4 is kept as deposited, however, stress in the magnetic film can be prevented. From the viewpoint of practical application, therefore, the insulator 4 is preferably left as deposited. If the lower insulator 4 becomes too thick, however, the generation, erasure or division of magnetic bubbles can not be carried out smoothly. For these reasons, the lower insulator 4 is preferably between about 0.05 to about 0.20 μm thick.

In the embodiments shown in FIGS. 5 and 6, the upper insulator 6 is deposited over a minor loop consisting of a propagation track 7 formed by ion implantation, in the same way as the region consisting of a propagation track of soft magnetic film (the major loop, etc.). In the present invention, the minor loop only has a propagation track formed by ion implantation, it does not have a conductor pattern or a propagation track of soft magnetic film. Hence, steps are not generated and the upper insulator 6 may be omitted from over the minor loop.

In the embodiment described above, only the region of the upper insulator 6 above the junction is selectively etch-removed, but in this case the region of the insulator deposited over the minor loop may also be removed simultaneously. As described already, not only the upper insulator 6 but also the lower insulator 4 may be removed in the same way so as to expose the surface of the magnetic film at the junction and over the minor loop.

In the present invention, it is possible to use the various conventional magnetic garnet films for magnetic bubble devices, such as $(YSmLuCa)_3(FeGe)_5O_{12}$, as the magnetic film for retaining the magnetic bubbles. These magnetic garnet films are formed on the (111) plane of a single non-magnetic crystal such as $Gd_3Ga_5O_{12}$ by known liquid phase epitaxial growth, but they may also be formed on planes other than the (111) plane. The magnetic garnet film preferably has a film thickness which is substantially equal to the bubble diameter.

A permalloy (Fe-Ni alloy) or the like can be used as the soft magnetic film, its film thickness is preferably between about 0.2 to about 0.5 μm. However, a thin, 0.03 to 0.05 μm thick permalloy film can be used for the detector.

Various kinds of ions can be used for the ion implantation, but hydrogen ions provide extremely favarouble results. Though hydrogen ions alone can be implanted without any problems, it is advantageous in practice to implant hydrogen ions with other ions such as Ne ions at different acceleration voltages because a strain layer having a flat strain distribution in the direction of depth can be formed in the magnetic film. The ion implantation depth is between $\frac{1}{4}$ to $\frac{1}{2}$ of the thickness of the magnetic film.

As is obvious from the above description, the present invention can form an extremely good, high density hybrid bubble memory device having a very small bit period (approximately 4 μm or less), and an extremely stable operation including a block replicator.

For ease of comprehension, the above description uses a magnetic garnet film as the magnetic film capable of retaining magnetic bubbles. Besides magnetic garnet films, films of amorphous rare earth transition metals such as Gd-Co, Ge-Fe and Gd-Co-Mo, and films of iron oxides such as hexagonal ferrite can also be used as the magnetic film.

What is claimed is:

1. A magnetic bubble memory device characterized in that said device is equipped with a major line or major loop, and with a minor loop of a magnetic bubble propagation track formed by ion implantation over a desired region of a magnetic film capable of retaining magnetic bubbles, at least part of the junction between said major line or said major loop and said minor loop consisting of a soft magnetic material film, and the thickness of an insulating film at said junction is smaller than that of said insulating film at the rest of the device, whereby a drop in the propagation margin at the junction can be prevented.

2. The magnetic bubble memory device as defined in claim 1 wherein said insulating film is a two-layered laminated insulating film.

3. The magnetic bubble memory device as defined in claim 2 wherein the upper insulating film of said two-layered insulating film is a film of a heat-resistant polymer resin.

4. The magnetic bubble memory device as defined in claim 3 wherein said heat-resistant polymer resin film is of polyimide isoindro-quinozolinedione.

5. The magnetic bubble memory device as defined in claim 3 wherein said heat-resistant polymer resin film is between about 0.3 to about 0.75 μm thick at the rest of the device other than at said junction.

6. The magnetic bubble memory device as defined in claim 3 wherein said lower insulating film is between about 0.05 to about 0.2 μm thick.

7. The magnetic bubble memory device as defined in claim 3 wherein the gap between said soft magnetic film over said major line or major loop and said magnetic film capable of retaining magnetic bubbles is between about 0.3 to about 0.8 μm.

8. The magnetic bubble memory device as defined in claim 3, wherein the lower insulating film of said two-layered insulating film is a film of $SiO_2$.

9. The magnetic bubble memory device as defined in claim 1 wherein the thickness of said insulating film at said junction is a maximum of about 0.2 μm.

10. The magnetic bubble memory device as defined in claim 1, wherein said soft magnetic material is permalloy.

11. The magnetic bubble memory device as defined in claim 1 wherein the thickness of said insulating film over said minor loop is substantially equal to the thickness of said insulating film at said major line or major loop.

12. The magnetic bubble memory device as defined in claim 1 wherein the thickness of said insulating film over said minor loop is smaller than the thickness of said insulating film at said major line or major loop.

13. The magnetic bubble memory device as defined in claim 1, wherein said major line or major loop includes a soft magnetic material propagation track having a film of soft magnetic material, and wherein the greater thickness of the insulating film at locations of the deivce other than said junction acts to prevent a drop in the propagation margin due to the occurrence of steps in the soft magnetic material propagation track.

14. The magnetic bubble memory device as defined in claim 13, wherein said soft magnetic material is permalloy.

15. A magnetic bubble memory device characterized in that said device is equipped with a major line or major loop, and with a minor loop of a magnetic bubble propagation track formed by ion implantation over a desired region of a magnetic film capable of retaining magnetic bubbles, at least part of the junction between said major line or said major loop and said minor loop consisting of a soft magnetic material film, and with an insulating film over the magnetic film capable of retaining magnetic bubbles, said insulating film being omitted at said junction, whereby a drop in the propagation margin at the junction can be prevented.

16. A magnetic bubble memory device characterized in that said device is equipped with a major line or major loop, and with a minor loop of a magnetic bubble propagation track formed by ion implantation over a desired region of magnetic film capable of retaining magnetic bubbles, at least part of the junction between said major line or said major loop and said minor loop consisting of a soft magnetic material film, and with an insulating film over the magnetic film capable of retaining magnetic bubbles, said insulating film being omitted at said junction and on the surface of the magnetic film of said minor loop, whereby a drop in the propagation margin at the junction can be prevented.

* * * * *